United States Patent [19]

Chatterjee et al.

[11] Patent Number: 4,997,808
[45] Date of Patent: Mar. 5, 1991

[54] SUPERCONDUCTIVE CERAMIC OXIDE COMBINATION

[75] Inventors: Dilip K. Chatterjee; Arun K. Mehrotra, both of Rochester; Jose M. Mir, Webster, all of N.Y.

[73] Assignee: Eastman Kodak Company, Rochester, N.Y.

[21] Appl. No.: 290,670

[22] Filed: Dec. 27, 1988

[51] Int. Cl.$^5$ .............................................. B32B 3/02
[52] U.S. Cl. ...................................... 505/1; 505/701; 505/702; 505/703; 505/708; 428/209; 428/323; 428/327; 428/411.1; 428/688; 428/930; 427/62
[58] Field of Search .......................... 505/1, 701–704; 428/209, 411.1, 457, 688, 901, 930, 323, 325, 327, 328, 330; 427/62

[56] References Cited

U.S. PATENT DOCUMENTS

| 4,097,282 | 6/1978 | Noonan et al. | 96/73 |
| 4,252,921 | 2/1981 | Merrill et al. | 525/437 |
| 4,291,153 | 9/1981 | Noonan et al. | 528/290 |
| 4,395,475 | 7/1983 | Noonan et al. | 430/69 |
| 4,419,437 | 12/1983 | Noonan et al. | 430/270 |

OTHER PUBLICATIONS

CA111(18):165103; Majumdar et al., Physica C (Amsterdam) 158(3), 413–18.
J. G. Bednorz and K. A. Müller, "Possible High $T_c$ Superconductivity in the Ba–La–Cu–O System", Z. Phys. B.—Condensed Matter, vol. 64, pp. 189–193 (1986).
C. W. Chu, P. H. Hor, R. L. Meng, L. Gao, Z. J. Huang, and Y. Q. Wang, "Evidence for Superconductivity Above 40 K in the La–Ba–Cu–O Compound System", Physical Review Letters, vol. 53, No. 4, pp. 405–407, Jan. 1987.
C. W. Chu, P. H. Hor, R. L. Meng, L. Gao, and Z. J. Huang, "Superconductivity at 52.5 K in the Lanthanum–Barium–Copper-Oxide System", Science Reports, vol. 235, pp. 567–569, Jan. 1987.
R. J. Cava, R. B. vanDover, B. Batlog, and E. A. Rietman, "Bulk Superconductivity at 36 K in $La_{1.8}Sr_{0.2}CuO_4$", Physical Review Letters, vol. 58, No. 4, pp. 408–410, Jan. 1987.
J. M. Tarascon, L. H. Greene, W. R. McKinnon, G. W. Hull, and T. H. Geballe, "Superconductivity at 40 K in the Oxygen-Defect Perovskites $La_{2-x}Sr_xCuO_{4-y}$", Science Reports, vol. 235, pp. 1373–1376, Mar. 13, 1987.
M. K. Wu, J. R. Ashburn, C. J. Torng, P. H. Hor, R. L. Meng, L. Gao, Z. J. Huang, Y. Q. Wang, and C. W. Chu, "Superconductivity at 93 K in a New Mixed-Phase Y–Ba–Cu–O Compound System at Ambient Pressure", Physical Review Letters, vol. 58, No. 9, pp. 908–910, Mar. 2, 1987.

Primary Examiner—Patrick Ryan
Attorney, Agent, or Firm—Carl O. Thomas

[57] ABSTRACT

A combination is disclosed comprising a superconductive ceramic oxide which degrades in conductivity upon contact of ambient air with its surface and, interposed between said ceramic oxide surface and ambient air, a passivant polymer.

20 Claims, 3 Drawing Sheets

SUPERCONDUCTIVE CERAMIC OXIDE COMBINATION

FIELD OF THE INVENTION

The present invention relates to combinations of stabilized superconductive ceramic oxide and passivant polymer and to processes for their preparation.

BACKGROUND OF THE INVENTION

The term "superconductivity" is applied to the phenomenon of immeasurably low electrical resistance exhibited by materials. Until recently superconductivity had been reproducibly demonstrated only at temperatures near absolute zero. As a material capable of exhibiting superconductivity is cooled, a temperature is reached at which resistivity decreases (conductivity increases) markedly as a function of further decrease in temperature. This is referred to as the superconducting transition temperature or, in the context of superconductivity investigations, simply as the critical temperature ($T_c$). $T_c$ provides a conveniently identified and generally accepted reference point for marking the onset of superconductivity and providing temperature rankings of superconductivity in differing materials.

It has been recently recognized that certain rare earth alkaline earth cuprates as well as other mixed metal cuprates exhibit superconducting transition temperatures ($T_c$) well in excess of the highest $T_c$ previously known for other metal oxides (a $T_c$ of 13.7° K. reported for lithium titanium oxide). These rare earth alkaline earth copper oxides also exhibit superconducting transition temperatures well in excess of the highest previously accepted reproducible $T_c$, 23.3° K. for the metal $Nb_3Ge$.

Recent discoveries of higher superconducting transition temperatures in rare earth alkaline earth copper oxides are reported in the following publications:

P-1 J. G. Bednorz and K. A. Müller, "Possible High $T_c$ Superconductivity in the Ba-La-Cu-O System", *Z. Phys. B.—Condensed Matter*, Vol. 64, pp. 189–193 (1986) revealed that polycrystalline compositions of the formula $Ba_xLa_{5-x}Cu_5O_{5(3-y)}$, where $x=1$ and 0.75 and $y>0$ exhibited superconducting transition temperatures in the 30° K. range:

P-2 C. W. Chu, P. H. Hor, R. L. Meng, L. Gao, Z. J. Huang, and Y. Q. Wang, "Evidence for Superconductivity above 40K in the La-Ba-Cu-O Compound System", *Physical Review Letters*, Vol. 53, No. 4, pp. 405–407, Jan. 1987, reported increasing $T_c$ to 40.2° K. at a pressure of 13 kbar. At the end of this article it is stated that M. K. Wu increased $T_c$ to 42° K. at ambient pressure by replacing Ba with Sr.

P-3 C. W. Chu, P. H. Hor, R. L. Meng, L. Gao, and Z. J. Huang, "Superconductivity at 52.5K in the Lanthanum-Barium-Copper-Oxide System", *Science Reports*, Vol. 235, pp. 567–569, Jan. 1987, a $T_c$ of 52.5° K. for $(La_{0.9}Ba_{0.1})_2CuO_{4-y}$ at high pressures.

P-4 R. J. Cava, R. B. vanDover, B. Batlog, and E. A. Rietman, "Bulk Superconductivity at 36K in $La_{1.8}Sr_{0.2}CuO_4$", *Physical Review Letters*, Vol. 58, No. 4, pp. 408–410, Jan. 1987, reported resistivity and magnetic susceptibility measurements in $La_{2-x}Sr_xCuO_4$, with a $T_c$ at 36.2° K. when $x=0.2$.

P-5 J. M. Tarascon, L. H. Greene, W. R. McKinnon, G. W. Hull, and T. H. Geballe, "Superconductivity at 40K in the Oxygen-Defect Perovskites $La_{2-x}Sr_xCuO_{4-y}$", *Science Reports*, Vol. 235, pp. 1373–1376, Mar. 13, 1987, reported title compounds ($0.05 \leq x \leq 1.1$) with a maximum $T_c$ of 39.3° K.

P-6 M. K. Wu, J. R. Ashburn, C. J. Torng, P. H. Hor, R. L. Meng, L. Gao, Z. J. Huang, Y. Q. Wang, and C. W. Chu, "Superconductivity at 93K in a New Mixed-Phase Y-Ba-Cu-O Compound System at Ambient Pressure", *Physical Review Letters*, Vol. 58, No. 9, pp. 908–910, Mar. 2, 1987, reported stable and reproducible superconducting transition temperatures between 80° and 93° K. at ambient pressures for materials generically represented by the formula $(L_{1-x}M_x)_aA_bD_y$, where $L=Y$, $M=Ba$, $A=Cu$, $D=O$, $x=0.4$, $a=2$, $b=1$, and $y \leq 4$.

The experimental details provided in publications P-1 through P-6 indicate that the rare earth alkaline earth copper oxides prepared and investigated were in the form of cylindrical pellets produced by forming an intermediate oxide by firing, grinding or otherwise pulverizing the intermediate oxide, compressing the particulate intermediate oxide formed into cylindrical pellets, and then sintering to produce a polycrystalline pellet. The pellets may then be ground to form powders of the superconducting ceramics. Alternative methods for forming sintered powders are also applicable to the formation of the superconducting ceramic powders.

In many of the applications for use of these powders, such as in the preparation of thick film circuits disclosed in the copending patent application of Strom et al, U.S. Ser. No. 068,391 filed July 1, 1987 entitled "Conductive Thick Films and Processes for Film Preparation", commonly assigned and here incorporated by reference now U.S. Pat. No. 4,908,346, the powders may be dispersed in aqueous media to produce screen printable inks. Also, powders may often be stored for extended periods of time where they are subject to exposure to atmospheric moisture.

Many of these superconducting ceramic compounds, e.g. perovskite oxides such as $YBa_2Cu_3O_{7-x}$, are unstable in the presence of moisture at room temperature, particularly when they are in powdered form thereby exposing a large reactive surface area. The reaction with moisture and possibly carbon dioxide produces a complex multiphase system and often results in a loss or deterioration of the superconductive properties. The moisture induced degradation of these compounds needs to be prevented in order to extend the shelf life, processing parameters and longevity in service of these materials and the articles made therefrom and also to permit flexibility of using aqueous-based solvents to make superconducting pastes or inks useful in the manufacture of thick film devices.

Polyester ionomers constitute an art recognized class of polymers. The following patents are illustrative of varied forms of these polymers:

P-7 Noonan et al U.S. Pat. No. 4,097,282;
P-8 Merrill et al U.S. Pat. No. 4,252,921;
P-10 Noonan et al U.S. Pat. No. 4,291,153;
P-11 Noonan et al U.S. Pat. No. 4,395,475; and
P-12 Noonan et al U.S. Pat. No. 4,419,437.

SUMMARY OF THE INVENTION

In one aspect this invention is directed to the combination comprising a superconductive ceramic oxide which degrades in conductivity upon contact of ambient air with its surface and, interposed between said ceramic oxide surface and ambient air, a passivant polymer characterized in that said polymer is selected from the group consisting of a polyester ionomer and an alkyl cellulose.

In another aspect this invention is directed to a screen printable composition for preparing a film of a superconductive ceramic oxide on a substrate comprising discrete particles of less than 2 μm in mean diameter comprised of a superconductive ceramic oxide which degrades in conductivity upon contact of ambient air with its surface and a vehicle surrounding said particles including a passivant polymer selected from the class consisting of an alkyl cellulose and a polyester ionomer.

In still another aspect this invention directed to a process of preparing a superconductive composition having a stable shelf life comprising mixing with discrete particles of a superconductive ceramic oxide which degrades in conductivity upon contact of ambient air with its surface a passivant polymer characterized in that said polymer is selected from the group consisting of a polyester ionomer and an alkyl cellulose.

BRIEF DESCRIPTION OF THE DRAWINGS

The invention can be better appreciated by reference to the following detailed description considered in conjunction with the drawings, in which.

DESCRIPTION OF THE PREFERRED EMBODIMENTS

The present invention has as its purpose to protect superconductive and similar ceramic oxides which are unstable in the presence of water, including moisture in the atmosphere. The invention is broadly applicable to these ceramic oxides in all possible physical forms—e.g., particles, pellets, thin or thick films, rods, wire, hollow tubes, and sintered, extruded, pressed, cast, or otherwise shaped articles. Further, the protection afforded by the present invention to these ceramic oxides is independent of the process employed for the formation of the ceramic oxide.

Since ceramic oxides in particulate form, which are useful precursors for fabrication of the ceramic oxides in varied forms, such as noted above, offer a high surface to volume ratio and therefore are particularly susceptible to instability, the description which follows is particularly directed to protection of ceramic oxide particles as a preferred embodiment of the invention. The general applicability of the protection described will be apparent from the preferred and related applications described.

In one preferred embodiment the present invention has as its purpose to make available superconductive and similar ceramic oxide particles, such as particles of the rare earth alkaline earth copper oxide type, which are stable in the presence of water. That is, the novel particles do not readily react with water molecules or hydroxyl ions so that the degradation of the conductive properties of the particles normally observed with similar prior art particles in the presence of water is substantially lessened or eliminated, allowing the novel particles to be stored under normal atmospheric conditions for extended periods and further allowing processing of the novel particles with aqueous media.

In further specific embodiments, the invention lends itself to the fabrication of thick films employing protected ceramic oxide particles in an aqueous medium. The invention can, of course, also be applied to protecting the thick film after its fabrication, regardless of the technique by which the thick film is fabricated.

The term "rare earth alkaline earth copper oxide" refers to a composition of matter containing at least one rare earth element, at least one alkaline earth element, copper, and oxygen. The term "rare earth" is employed to designate yttrium and lanthanides—i.e., elements of the lanthanide series. Lanthanum, samarium, europium, gadolinium, dysprosium, holmium, erbium, and ytterbium are particularly preferred lanthanides. The term "alkaline earth" indicates elements of Group 2 of the Periodic Table of elements as adopted by the American Chemical Society. Calcium, strontium and barium are preferred alkaline earth elements for the practice of this invention.

In keeping with the established practice in the ceramics art of shortening lengthy chemical names of mixed metal oxides by substituting acronyms based on the first letters of the metals present, the term "RAC" is hereinafter employed to indicate generically rare earth alkaline earth copper oxides. When it is intended to designate specifically a lanthanide or yttrium as the rare earth component, L or Y, respectively, is substituted for R; and, when it is intended to designate specifically strontium or barium as the alkaline earth component, S or B, respectively, is substituted for A.

It is known that several of the RAC oxide compounds as well as other ceramic oxides e.g. PAC oxide (wherein P is a pnictide, e.g. bismuth), have superconductive properties. It is also known that the electrical properties of at least some of these oxides degrade in the presence of moisture. While the description which follows is directed specifically to the embodiment $YBa_2Cu_3O_{7-x}$ powders wherein x is less than 0.5, the general applicability to other similar ceramic oxides can be readily appreciated.

In general, in accordance with the present invention a superconductive ceramic oxide which exhibits degradation of conductivity in ambient air (or more rapidly in water) is treated with a polymer which forms a coating over the superconductive ceramic oxide surface that would otherwise be exposed to air or moisture contact.

The present invention is particularly suitable for use with superconducting oxide powders which exhibit phase separation upon contact with water. The RAC oxide perovskites and particularly $YBa_2Cu_3O_{7-x}$ are typical of such superconducting powders.

It has been found quite unexpectedly that alkyl cellulose polymers and polyester ionomer polymers are effective to stabilize superconductive ceramic oxides while other polymers are ineffective.

Polyester ionomers are polyesters which contain at least one ionic moiety.

Such ionic moieties can be provided by either ionic diol recurring units or ionic dicarboxylic acid recurring units, but preferably by the latter. Such ionic moieties can be anionic or cationic in nature, but preferably, they are anionic. Exemplary ionic groups include carboxylic acid, sulfonic acid, quaternary ammonium, disulfonylimino groups, and their salts.

In a preferred embodiment of this invention, the amorphous polyesters comprise from about 2 to about 25 mole percent, based on total moles of dicarboxylic acid recurring units, of ionic dicarboxylic acid recurring units.

Ionic dicarboxylic acids found to be particularly useful in the practice of this invention are those having units represented by the formula:

wherein each of m and n is 0 or 1 and the sum of m and n is 1; each X is carbonyl; Q has the formula:

Q' has the formula:

Y is a divalent aromatic radical, such as arylene (e.g. phenylene, naphthalene, xylylene, etc.) or arylidyne (e.g. phenenyl, naphthylidyne, etc.); Y' is a monovalent aromatic radical, such as aryl, aralkyl or alkaryl (e.g. phenyl, p-methylphenyl, naphthyl, etc.), or alkyl having from 1 to 12 carbon atoms, such as methyl, ethyl, isopropyl, n-pentyl, neopentyl, 2-chlorohexyl, etc., and preferably from 1 to 6 carbon atoms; and M is a solubilizing cation and preferably a monovalent cation such as an alkali metal or ammonium cation.

Exemplary preferred dicarboxylic acids and functional equivalents from which such ionic recurring units are derived are 3,3'-[(sodioimino)disulfonyl]dibenzoic acid; 3,3'-[(potassioimino)disulfonyl]dibenzoic acid; 3,3'-[(lithioimino)disulfonyl]dibenzoic acid; 4,4'-[(lithioimino)disulfonyl]dibenzoic acid; 4,4'-[(sodioimino)-disulfonyl]dibenzoic acid; 4,4'-[(potassioimino)disulfonyl]dibenzoic acid; 3,4'-[(lithioimino)disulfonyl]-dibenzoic acid; 3,4'-[(sodioimino)disulfonyl]dibenzoic acid; 5-[4-chloronaphth-1-ylsulfonyl(sodioimino)sulfonyl]-isophthalic acid; 4,4'-[(potassioimino)disulfonyl]-dinaphthoic acid; 5-[p-tolylsulfonyl(potassioimino)sulfonyl]isophthalic acid; 4-[p-tolylsulfonyl(sodioimino)-sulfonyl]1,5-naphthalenedicarboxylic acid; 5-[n-hexyl-sulfonyl(lithioimino)sulfonyl]isophthalic acid; 2-[phenylsulfonyl(potassioimino)sulfonyl]terephthalic acid and functional equivalents thereof. These and other dicarboxylic acid useful in forming preferred ionic recurring units are described in Caldwell et al U.S. Pat. No. 3,546,180, the disclosure of which is herein incorporated by reference.

Ionic dicarboxylic acid recurring units can also be derived from 5-sodiosulfobenzene-1,3-dicarboxylic acid, 5-sodiosulfocyclohexane-1,3-dicarboxylic acid, 5-(4-sodiosulfophenoxy)benzene-1,3-dicarboxylic acid, 5-(4-sodiosulfophenoxy)cyclohexane-1,3-dicarboxylic acid, similar compounds and functional equivalents thereof and others described in U.K. Patent Specification No. 1,470,059 (published Apr. 14, 1977).

The amorphous polyesters preferably comprise from about 75 to about 98 mole percent, based on total moles of dicarboxylic acid recurring units, of dicarboxylic acid recurring units which are nonionic in nature. Such nonionic units can be derived from any suitable dicarboxylic acid or functional equivalent which will condense with a diol as long as the resulting polyester is substantially amorphous. Preferably, such units have the formula:

wherein R is a saturated or unsaturated divalent hydrocarbon. Preferably, R is alkylene of 2 to 20 carbon atoms, (e.g. ethylene, propylene, neopentylene, 2-chlorobutylene, etc.); cycloalkylene of 5 to 10 carbon atoms, (e.g. cyclopentylene, 1,3-cyclohexylene, 1,4-cyclohexylene, 1,4-dimethylcyclohexylene, etc.); or arylene of 6 to 12 carbon atoms, (e.g. phenylene, xylylene, etc.). More preferably, R is alkylene of 2 to 20 carbon atoms.

Such recurring units are derived from, for example, phthalic acid, isophthalic acid, terephthalic acid, malonic acid, succinic acid, glutaric acid, adipic acid, suberic acid, and 1,3-cyclohexane dicarboxylic acid and functional equivalents thereof. Dicarboxylic acids which have moieties that are sensitive to actinic radiation are also useful. Exemplary radiation sensitive dicarboxylic acids or functional equivalents thereof are described in Arcesi et al U.S. Pat. No. 3,929,489, the disclosure of which is herein incorporated by reference.

The dicarboxylic acid recurring units are linked in a polyester by recurring units derived from difunctional compounds capable of condensing with a dicarboxylic acid or a functional equivalent thereof. Such difunctional compounds include diols of the formula HO—R$^1$—OH wherein R$^1$ is a divalent aliphatic, alicyclic or aromatic radical of from 2 to 12 carbon atoms and includes hydrogen, carbon, and, optionally, ether oxygen atoms.

Such aliphatic, alicyclic, and aromatic radicals include alkylene, cycloalkylene, arylene, alkylenearylene, alkylenecycloalkylene, alkylenebisarylene, cycloalkylenebisalkylene, arylenebisalkylene, alkylene-oxyalkylene, alkylene-oxy-arylene-oxy-alkylene, arylene-oxy-alkylene, alkylene-oxy-cycloalkylene-oxy-alkylene, etc. Preferably, R$^1$ contains an ether linkage, such as in cycloalkylene-oxy-alkylene or alkylene-oxy-alkylene.

Exemplary diols include ethylene glycol, diethylene glycol, triethylene glycol, 1,3-propanediol, 1,4-butanediol, 2-methyl-1,5-pentanediol, neopentyl glycol, 1,4-cyclohexanedimethanol, 1,4-bis(β-hydroxyethoxy)-cyclohexane, quinitol, norcamphanediols, 2,2,4,4-tetraalkylcyclobutane-1,3-diols, p-xylene diol and Bisphenol A.

In a preferred embodiment, the substantially amorphous polyesters described herein comprise diol recurring units of either of the formulae wherein p is an integer from 1 to 4. Such recurring units are present in the polyesters in an amount of at least 50 mole percent, and most preferably from about 50 to 100 mole percent, based on total moles of diol recurring units.

Amorphous polyesters particularly useful in the practice of this invention include
poly[1,4-cyclohexylenedi(oxyethylene)-3,3'-[sodi-oimino)disulfonyl]dibenzoate-co-succinate 5:95 molar ratio)]
poly[1,4-cyclohexylenedi(oxy-ethylene)-co-ethylene (75:25 molar ratio)]
poly{3,3'-[(potassioimino)disulfonyl]dibenzoate-co-azelate (10:90 molar ratio)}
poly{1,4-cyclohexylenedi(oxyethylene)-3,3'-[(sodi-oimino)disulfonyl]-dibenzoate-co-adipate (95:5 molar ratio)}
poly{1,4-cyclohexylenedi(oxyethylene)-3,3'-[(sodi-oimino)disulfonyl]dibenzoate-co-3,3'-(1,4-phenylene)dipropionate (20:80 molar ratio)} and
poly[p-phenylenebis(oxyethylene)-5-(4-sodiosulfo phenoxy)-1,3-benzenedicarboxylate-co-terephthalate (30:70 molar ratio)].
Other useful polyester ionomers are disclosed in P-7 to P-12, cited above, and here incorporated by reference.

Since the superconductive ceramic oxides are subject to degradation by moisture, it is particularly surprising that aqueous solutions of these polyester ionomers are effective to stabilize the superconductive ceramic oxides of this invention.

In addition to polyester ionomers it has been observed that alkyl cellulose polymers are also effective to stabilize the superconductive ceramic oxides. Generally any soluble alkyl cellulose can be employed. Preferred alkyl cellulose polymers are those in which the alkyl moiety contains from 1 to 10 carbon atoms, optimally from about 1 to 6 carbon atoms. These polymers are generally recognized to be soluble in most common organic solvents. Specific preferred examples of useful alkyl cellulose are methyl cellulose, ethyl cellulose, n-propyl cellulose, isobutyl cellulose, and n-hexyl cellulose.

Figure 1:
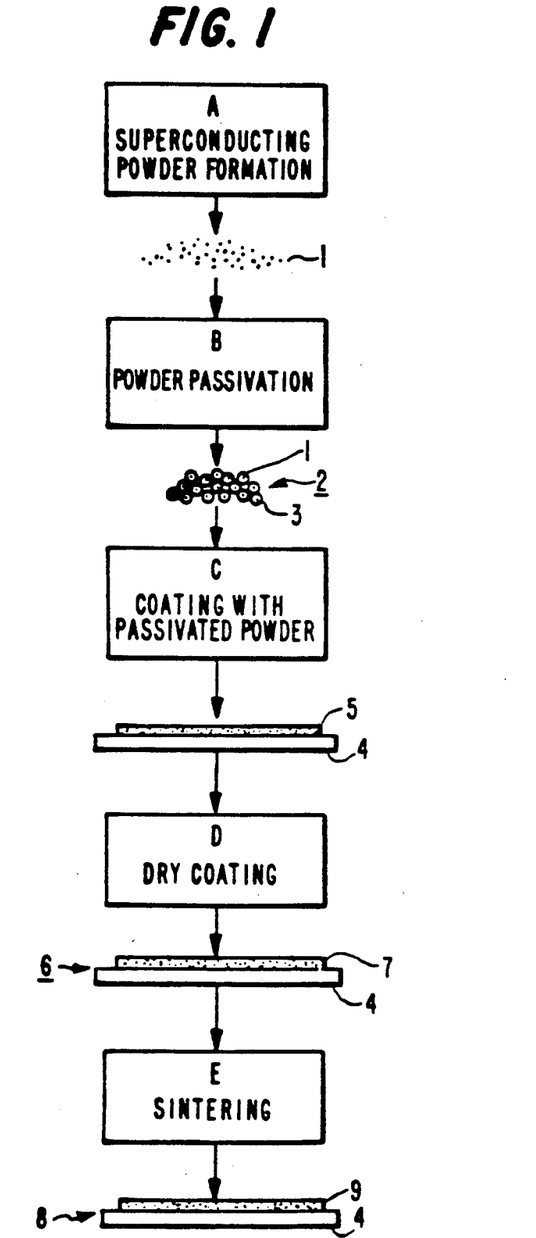
FIG. 1 is a schematic diagram showing process steps and articles produced thereby.

The invention can best be appreciated by first describing the method of preparing conductive powders having a passivating or stabilizing coating on the surface thereof and then describing the process of preparing intermediate articles and conductive articles utilizing such stabilized powders as schematically shown in FIG. 1.

Referring to Step A of FIG. 1, a superconducting compound powder is prepared by mixing the oxides and/or carbonates of the constituent metals in the compound in appropriate proportions and then calcining, grinding and sintering to form a single phase superconductive compound and grinding the compound to form an uncoated superconductive powder 1 as is known in the art. Any other convenient conventional technique for preparing the ceramic oxide powder, such as the spray drying of carboxylates (e.g., oxalates), nitrates, chlorides, and the like, can also be used.

When the powder is to be used for the production of thick film articles, the particle size of the powder can be of any size convenient for coating. The particles can exhibit a mean diameter up to the thickness of the coating to be formed, but more uniform films are realized when the mean particle diameters are relatively small in relation to the thickness of the final film to be formed. For the production of superconductive thick films, typically in the range of from 5 to 200 $\mu$m in thickness, the particles are preferably less than about 2 $\mu$m in mean diameter, optimally less than 1 $\mu$m in mean diameter. The minimum mean diameter of the particles is limited only by synthetic convenience.

In Step B, the single phase superconducting oxide powder is mixed with a solution containing a passivating polymer. The solution may be an aqueous or nonaqueous solution of the polymer, depending upon the particular polymer and its solubility in water or other solvents. The powder is then dried, e.g. in an oven or by means of a heat lamp, resulting in a passivated superconducting powder 2 comprising powder particles 1 having a polymer coating 3 thereon. The powder may be stored under atmospheric conditions for future use or used immediately. If it is used immediately, then the drying step described above may be eliminated. The quantity of polymer required is dependent upon the surface area of the powder to be passivated. Generally, the minimum quantity of polymer to achieve adequate coverage for passivation is about 1 mg. polymer per square meter of surface area presented by the superconductive ceramic oxide. For practical purposes, the maximum quantity of polymer is about 200 mg/m$^2$ of superconductive ceramic oxide surface area. Quantities above this amount do not add to stabilization and may adversely limit the desired loading of the superconductor in subsequent process steps.

The passivant polymer can also be relied upon to increase viscosity. This facilitates coating by powder compositions, such as are employed in thick film coating and screen printing. The use of known viscosity control agents as a separate component in the composition is, of course, an alternative.

In Step C, a small amount of a liquid vehicle is mixed with the passivated powder 2 to form a coatable slurry or paste. Passivation of the powder allows for the use of aqueous vehicles without the danger of degradation of the powder. Only a very small amount of liquid is required to promote particle cohesion and thereby form a paste. Typically the liquid constitutes less than 20 percent of the total composition by weight and preferably less than 15 percent of the total composition by weight. While optimum paste consistencies can vary depending upon the selection of processes for coating the paste, it is generally contemplated that the paste viscosity will be in the range of from $5 \times 10^4$ to $3 \times 10^6$ centipoise, preferably from $1 \times 10^5$ to $2.5 \times 10^6$ centipoise. The paste is then applied to a substrate 4, e.g. single crystal magnesia or polycrystalline alumina, in the form of a thick film 5. Any of the known techniques, for example, spraying, screen printing or doctor blading can be utilized to apply the paste to the substrate 4. The film can be a uniform continuous film or a patterned film, as desired. Contemplated film thicknesses are from 5-200 $\mu$m and preferably in the order of about 10-100 $\mu$m. However, film thickness is not critical and may be greater or less than the above mentioned thicknesses.

As an alternative to first forming a passivated polymer as in Step B and then forming a paste or slurry which is applied to a substrate as in Step C, it is also contemplated that where no extended time exists between passivation and use of the powder, e.g. for making a thick film article, one can apply the powder-polymer solution slurry formed in Step B directly to a substrate in a manner as described in Step C. This will eliminate the need to first dry the passivated powder and then reconstitute a slurry before applying the slurry as a coating on the substrate.

Although in the embodiment described Step C involves forming a thick film on a substrate, it is apparent that the powder-polymer solution slurry formed in Step B could alternatively be employed to form any desired type of shaped article, such as any of the forms noted above, and than any convenient conventional shaping process, including hot pressing, extrusion, slip casting, tape casting, wire drawing, and the like, can be employed.

In Step D, the thick film 5 is dried leaving a stable article of manufacture 6 comprising the dried thick passivated superconductive particle film 7 on the substrate 4. This article 6 can be sold to subsequent manufacturers for further processing, e.g., as shown in Step E wherein the article 6 is heated at temperatures above about 600° C. and preferably about 850° C. to remove the passivating polymer film from the superconductive particles and sinter the particles to form the final superconductive article 8 consisting of a dense superconductive thick film 9 on the substrate 4.

Although the foregoing process has been described in terms of extremely simple articles in which the superconductive oxide layer is formed entirely on an insulative substrate, it is appreciated that in many practical applications only a portion of the superconductive oxide layer will be formed directly on a surface of the substrate. For example, in fabricating electrical circuit components it is common practice to first coat metal pads (conductive areas) on an insulative substrate for the purpose of facilitating external lead (pin) connections. The superconductive oxide layer or several portions of the superconductive oxide layer can be formed on the insulative substrate to provide a conduction path or paths between spaced pads or other conductive regions previously formed on the substrate. Any conductive material can be precoated on the substrate which is capable of withstanding the temperatures required to form the superconductive oxide layer. For example, gold pads are commonly used in electrical circuit component fabrication and are entirely compatible with fabricating superconductive oxide layers as required by this invention. Electrical connection to the surface of a thick film which has already been coated on the substrate and fired to produce the electrically conductive superconductive oxide phase is also possible. Metal pads (e.g., indium) can be made to adhere to the crystalline superconductive oxide surface at relatively low temperatures (<200° C.). Subsequent electrical connection to the overlying metal pad can be made using conventional bonding techniques. Soldered wire connections to metal pads are, of course, most common. We have observed that wire can be bonded directly to indium metal pads without employing solder. We have also been successful in bonding wire to superconductive ceramic oxides without first forming bonding pads on the ceramic oxide body.

Once the final device containing the ceramic oxide body has been formed, it is recognized that a passivant polymer can be applied to the exposed surfaces of the ceramic oxide body to protect it from degradation.

Electrically conductive crystalline ceramic oxide layers can be formed on a wide variety of substrates. In general any conventional electrical conductor substrate capable of withstanding processing temperatures can be employed. For example, metal, glass, ceramic, and semiconductor substrates all possess sufficient thermal stability to accept crystalline superconductive oxide layers applied by one or more of the procedures described above. Substrates in both polycrystalline and monocrystalline form have been successfully employed.

While the articles referred to above are in the form of either patterned or continuous thick films wherein patterns can take the form of a desired circuit or article, e.g. a coil, it should be understood that the passivated superconducting powders can be utilized for the manufacture of other types of conductive articles, such as any of those mentioned above, and that the passivant polymer can be brought in contact with exposed ceramic oxide surfaces of any of these devices for stabilization of intermediate or end-use articles.

EXAMPLES

Figure 2:
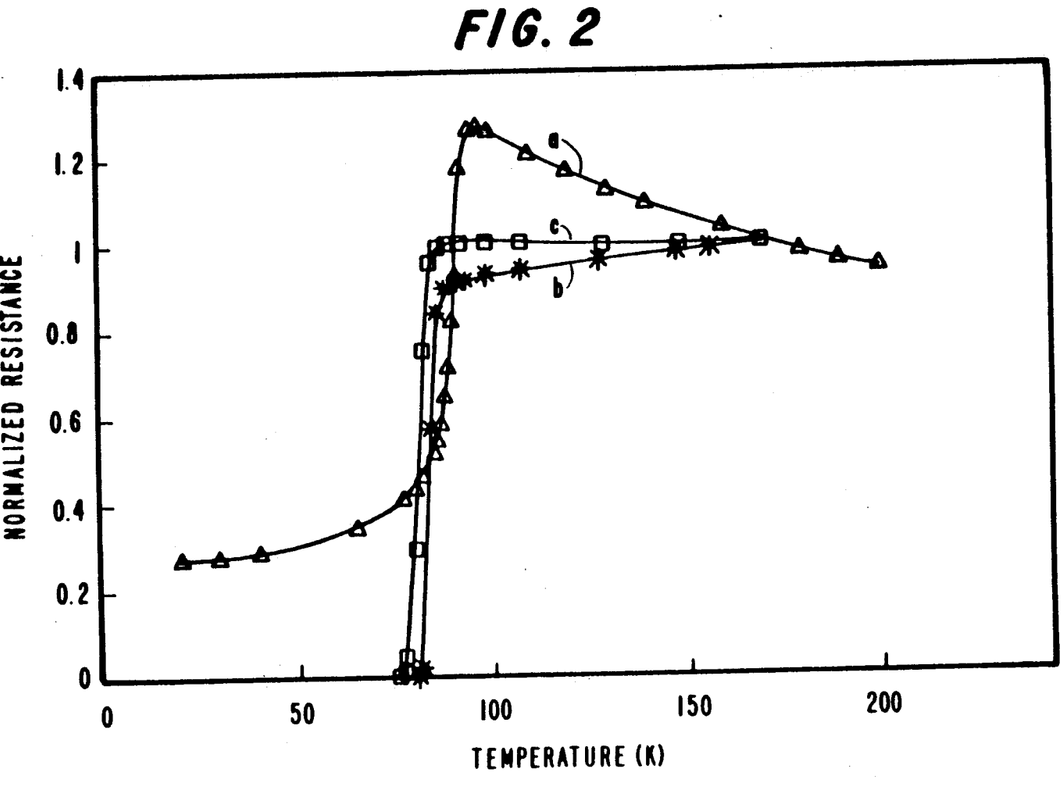
FIG. 2 is a series of plots of resistance (normalized) as a function of temperatures (° K) for articles formed from superconductive powders treated in accordance with the present invention and for articles formed from untreated powders.

Details of the preparation and performance of articles according to this invention and comparisons with articles formed in a similar manner but without passivation of the superconducting powders are illustrated by the following examples and FIG. 2.

EXAMPLE 1

Figure 3:
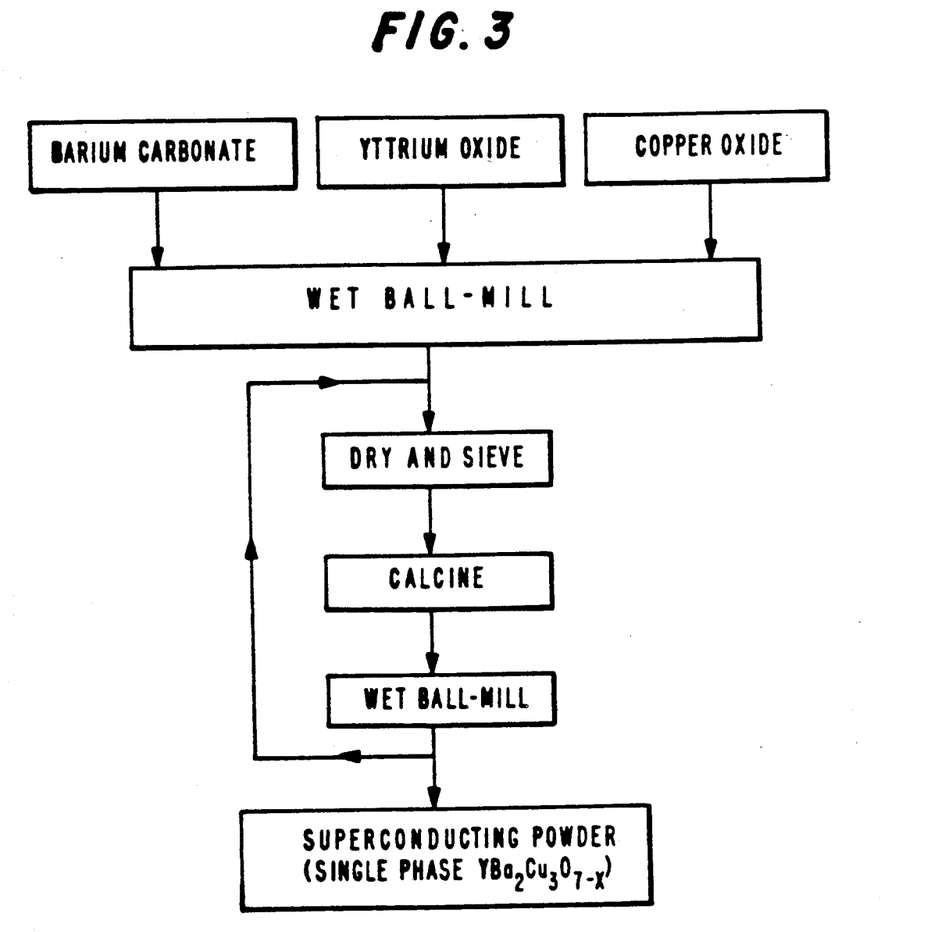
FIG. 3 is a flow chart showing process steps for making a ceramic superconducting powder.

This example illustrates the formation of a single phase superconducting $YBa_2Cu_3O_{7-x}$ compound in the form of a single phase orthorhombic powder having a mean particle size of <1 micron average particle size. The powder is formed by conventional mixed oxide ceramic processing as shown in FIG. 3.

To make a kilogram of powder of $YBa_2Cu_3O_{7-x}$: 560 grams $BaCO_3$, 172 grams $Y_2O_3$ and 363 grams CuO were mixed together in a ball mill employing isopropyl alcohol and $ZrO_2$ balls for 300 minutes. The mixture was then calcined at 875° C. in air for 600 minutes. The calcined mixture was then ground in a ball mill for 300 minutes using isopropyl alcohol for wetting. Thereafter the milled particles were calcined at 920° C. in oxygen for 600 minutes to form a single phase $YBa_2Cu_3O_{7-x}$ compound. The resultant material was superconducting and was ground again for 300 minutes to obtain a fine powder having a mean particle size of less than 1 μm. X-ray diffraction studies show the powder to be a single phase orthorhombic material.

COMPARATIVE EXAMPLE 2

The effect of water on the nonpassivated powder prepared in accordance with Example 1 was determined by mixing a quantity of the powder with 20 wt. % of deionized water and then drying the mixture under a heat lamp. X-ray diffraction studies of this water treated powder indicated a multiphase structure comprising the superconducting orthorhombic phase, CuO phase and a $BaCO_3$ phase.

EXAMPLE 3

In accordance with the present invention, single phase superconducting powder of Example 1 was mixed with 20 weight percent, based on total weight, of an aqueous solution of poly[p-phenylenebis(oxyethylene)-5-(4-sodiosulfophenoxy)-1,3-benzenedicarboxylate-co-terephthalate (30:70 molar ratio)], the polyester ionomer being present in concentration of 15 percent by weight, based on the weight of water, and dried under a heat lamp. The X-ray diffraction pattern of the polyester ionomer treated powder showed the presence of the same single phase orthorhombic crystalline structure as the original powder. This indicates that the ionomer protected the powder from degradation by the water.

EXAMPLE 4

In accordance with the present invention, single phase superconducting powder of Example 1 was mixed with 20 weight percent, based on total weight, ethyl cellulose dissolved in trimethylpentyl isobutyrate (15 weight percent cellulose acetate, based on the weight of solvent, the solution being purchased from Electro Science Laboratories). This mixture was also dried under a heat lamp. X-ray diffraction patterns of the dried ethyl cellulose treated powder also showed a single phase orthorhombic crystal structure indicating the absence of degradation of the powder.

COMPARATIVE EXAMPLE 5

Testing procedures similar to those of Examples 3 and 4 were repeated, but with the terpolymer poly[styrene-co-butyl acrylate-co-methacrylic acid (45:50:5 molar ratio)] replacing the passivant polymer. Phase separation occurred as described in Example 2.

COMPARATIVE EXAMPLE 6

Testing procedures similar to those of Examples 3 and 4 were repeated, but with the polyvinyl alcohol replacing the passivant polymer. Phase separation occurred as described in Example 2.

COMPARATIVE EXAMPLE 7

Testing procedures similar to those of Examples 3 and 4 were repeated, but with the polyvinyl butyral replacing the passivant polymer. Phase separation occurred as described in Example 2.

It was concluded from these experiments that water promotes phase separation in the superconducting ceramic oxide powders forming, in the case of $YBa_2Cu_3O_{7-x}$, CuO and $BaCO_3$ phases. Only polyester ionomers and alkyl cellulose were observed to be effective passivants.

EXAMPLE 8

In order to determine the effect of phase separation and passivation on the superconducting properties of articles, such as thick films, prepared from the various powders treated as set forth in Examples 2-4, thick films of the (a) water treated, (b) polyester ionomer treated and (c) ethyl cellulose treated powders were prepared and their superconducting properties were measured. These experiments are set forth in Examples 8 a-c, respectively.

The respective treated powders were mixed with 20 wt. % deionized water to make viscous pastes and doctor blade coated onto single crystal magnesia substrates by well known doctor blading technique to form thick films (~30 μm). The films were then heated in oxygen at 950° C. for five minutes and then cooled down to room temperature in oxygen environment. The oxygen environment aids in balancing the oxygen content of the superconducting film.

The sheet resistance at room temperature for these samples were as follows:
a. Films derived from powder treated with water—4 ohms/square
b. Films derived from powder treated with aqueous polyester ionomer—1 ohm/square
c. Films derived from powder treated with nonaqueous ethyl cellulose—1 ohm/square.

These measurements indicate the deleterious effect of water on the room temperature resistance of the non-passivated superconducting oxide powders. They also indicate the adverse effect of water observed in sample (a) is permanent and not reversible by the high temperature treatment. The degradation of the microstructural features due to water exposure of nonpassivated powders has also been confirmed by scanning electron microscopy.

Low temperature (superconducting) resistance data were also taken of each of the above films. The results of these measurements are shown in FIG. 2 wherein normalized resistance is plotted against temperatures in degrees Kelvin. As can be seen from FIG. 2, sample 8a prepared from the water treated oxide powder does not attain zero resistance even at temperatures as low as 8° K. By comparison, the polymer treated samples 8b and 8c attain a zero resistance superconducting state at temperatures in the range of 75°-80° K. Further, in the water treated, nonpassivated, sample 5a the prominent semiconducting behavior of the material before $T_c$, the onset of the resistance decrease, is also noticeable.

In still other experiments, the untreated superconducting powders and the powders passivated with the polyester ionomer and the ethyl cellulose as set forth above were subjected to an environmental stability test at 70% relative humidity and 50° C. for 1 hour, 24 hours, 3 days, 3 months, and 6 months. X-ray diffraction patterns again indicate a degradation of the untreated powder as evidenced by the formation of $BaCO_3$ and CuO phases which increased with time in the test chamber while no such degradation was found with the powders treated in accordance with this invention even after six months.

The invention has been described in detail with particular reference to preferred embodiments thereof, but it will be understood that variations and modifications can be effected within the spirit and scope of the invention.

What is claimed is:

1. The combination comprising a superconductive ceramic oxide which degrades in conductivity upon contact of ambient air with its surface and, interposed between said ceramic oxide surface and ambient air in the amount of at least 1 mg per square meter of surface area of said superconductive ceramic oxide, a passivant polymer selected from the group consisting of a polyester ionomer and an alkyl cellulose.

2. The combination according to claim 1 further characterized in that said superconductive ceramic oxide is a rare earth alkaline earth copper oxide.

3. The combination according to claim 2 further characterized in that said ceramic oxide is represented by the formula $RA_2C_3O_{7-x}$ wherein R is a rare earth selected from the group consisting of yttrium and a lanthanide element, A is an alkaline earth selected from the group consisting of barium and strontium, C is copper and x is less than 0.5.

4. The combination according to claim 1 further characterized in that said polymer is present in an amount of from 1-100 mg per square meter of said surface presented by said superconductive ceramic oxide to ambient air.

5. The combination according to claim 1 further characterized in that said superconductive ceramic oxide is present in the form of a crystalline superconductive body.

6. The combination according to claim 5 further characterized in that said crystalline superconductive body is present in the form of a coating on a substrate.

7. The combination according to claim 1 further characterized in that said superconductive ceramic oxide is present in the form of discrete particles and said polymer passivant is present in a concentration of from 1 to 200 mg per square meter of surface area of said superconductive ceramic oxide.

8. The combination according to claim 7 further characterized in that said superconductive ceramic oxide discrete particles are less than 2 μm in mean diameter.

9. The combination according to claim 8 further characterized in that said discrete particles are less than 1 μm in mean diameter.

10. The combination according to claim 7 further characterized in that said passivant polymer encapsulates said discrete particles.

11. The combination according to claim 1 further characterized in that said passivant polymer is an alkyl cellulose in which said alkyl moiety contains from 1 to 10 carbon atoms.

12. The combination according to claim 11 further characterized in that said alkyl moiety contains from 1 to 6 carbon atoms.

13. The combination according to claim 1 further characterized in that said passivant polymer is a water soluble polyester ionomer.

14. The combination according to claim 13 further characterized in that said water soluble polyester ionomer is a substantially amorphous polyester comprising

(1) dicarboxylic acid recurring units of which from about 2 to about 25 mole percent, based on total moles of said dicarboxylic acid recurring units, are ionic dicarboxylic acid recurring units of the formula:

wherein each of m and n is 0 or 1 and the sum of m and n is 1; each X is carbonyl; Q has the formula:

Q' has the formula:

Y is a divalent aromatic radical; Y' is a monovalent aromatic radical or alkyl; and M is a monovalent cation; and the remainder of said dicarboxylic acid recurring units are nonionic and have the formula wherein R is alkylene, cycloalkylene or arylene; and (2) diol recurring units derived from diols of the formula HO—R¹—OH wherein R¹ is a divalent aliphatic, alicyclic or aromatic radical having from 2 to 12 carbon atoms and containing an ether linkage.

15. The combination according to claim 14 further characterized in that said polyester comprises aliphatic diol recurring units having either of the formulae wherein p is an integer from 1 to 4.

16. A screen printable composition for preparing a film of a superconductive ceramic oxide on a substrate comprising discrete particles of less than 2 μm in mean diameter comprised of a superconductive ceramic oxide which degrades in conductivity upon contact with ambient air with its surface and a vehicle surrounding said particles including a passivant polymer in the amount of 1 to 200 mg per square meter of surface area of said superconductive ceramic oxide selected from the class consisting of an alkyl cellulose and a polyester ionomer.

17. A screen printable composition according to claim 16 in which said ceramic oxide is represented by the formula $RA_2C_3O_{7-x}$ wherein R is a rare earth selected from the group consisting of yttrium and a lanthanide element, A is an alkaline earth selected from the group consisting of barium and strontium, C is copper and x is less than 0.5 and said vehicle is comprised of said alkyl cellulose dispersed in an organic solvent, said alkyl moiety containing from 1 to 6 carbon atoms.

18. A screen printable composition according to claim 16 in which said ceramic oxide is represented by the formula $RA_2C_3O_{7-x}$ wherein R is a rare earth selected from the group consisting of yttrium and a lanthanide element, A is an alkaline earth selected from the group consisting of barium and strontium, C is copper and x is less than 0.5 and said vehicle is comprised of said polyester ionomer dispersed in an aqueous solvent, said polyester ionomer being comprised of

(1) dicarboxylic acid recurring units of which from about 2 to about 25 mole percent, based on total moles of said dicarboxylic acid recurring units, are ionic dicarboxylic acid recurring units of the formula:

wherein each of m and n is 0 or 1 and the sum of m and n is 1; each X is carbonyl; Q has the formula:

Q' has the formula:

Y is a divalent aromatic radical; Y' is a monovalent aromatic radical or alkyl; and M is a monovalent cation; and the remainder of said dicarboxylic acid recurring units are nonionic and have the formula wherein R is alkylene, cycloalkylene or arylene; and (2) diol recurring units derived from diols of the formula HO—$R^1$—OH wherein $R^1$ is a divalent aliphatic, alicyclic or aromatic radical having from 2 to 12 carbon atoms and containing an ether linkage.

19. A process of preparing a superconductive composition having a stable shelf life comprising mixing with discrete particles of a supreconductive ceramic oxide which degrades in conductivity upon contact of ambient air with its surface a passivant polymer characterized in that said polymer is selected from the group consisting of a polyester ionomer and an alkyl cellulose and said passivant polymer is present in the amount of 1 to 200 mg per square meter of surface area of said superconductive ceramic oxide.

20. A process of preparing a superconductive article comprising forming a superconductive elemeent comprised of a unitary crystalline superconductive element comprised of ceramic oxide which degrades in conductivity upon contact with ambient air and a coating separating said superconductive element from ambient air comprised of a passivant polymer selected from the group consisting of a polyester ionomer and an alkyl cellulose and said passivant polymer is present in the amount of at least 1 mg per square meter of surface area of said superconductive ceramic oxide.

* * * * *